United States Patent
Ray et al.

(10) Patent No.: US 11,251,168 B2
(45) Date of Patent: *Feb. 15, 2022

(54) THREE-LAYER COLOR DISPLAY USING STACKED LED LAYERS

(71) Applicant: Nthdegree Technologies Worldwide Inc., Tempe, AZ (US)

(72) Inventors: William Johnstone Ray, Fountain Hills, AZ (US); Michael LeFebvre, Phoenix, AZ (US); Darin Wagner, Phoenix, AZ (US); Richard A. Blanchard, Los Altos, CA (US)

(73) Assignee: NthDegree Technologies Worldwide Inc., Tempe, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/089,142

(22) Filed: Nov. 4, 2020

(65) Prior Publication Data

US 2021/0050334 A1 Feb. 18, 2021

Related U.S. Application Data

(63) Continuation of application No. 16/843,590, filed on Apr. 8, 2020, now Pat. No. 11,164,851, which is a
(Continued)

(51) Int. Cl.
*H01L 25/075* (2006.01)
*H01L 25/065* (2006.01)

(52) U.S. Cl.
CPC ...... *H01L 25/0756* (2013.01); *H01L 25/0652* (2013.01); *H01L 25/0753* (2013.01)

(58) Field of Classification Search
None
See application file for complete search history.

(56) References Cited

U.S. PATENT DOCUMENTS 9,368,549 B1 6/2016 Oraw et al.
10,636,772 B1 * 4/2020 Ray .................. H01L 33/62
(Continued)

FOREIGN PATENT DOCUMENTS

WO 2005099310 A2 10/2005
WO 2018156876 A1 8/2018

OTHER PUBLICATIONS

EPO, "Extended European Search Report," dated Dec. 15, 2020, 6 pages.

*Primary Examiner* — J. E. Schoenholtz
(74) *Attorney, Agent, or Firm* — Patent Law Group; Brian Ogonowsky

(57) ABSTRACT

Over a flexible substrate are deposited stacked pixel layers including a bottom layer of LEDs forming blue pixels, a middle layer of LEDs forming green pixels, and a top layer of LEDs forming red pixels. Each LED die comprises an LED portion and an integrated transistor portion. Applying a voltage to a control terminal of the transistor portion energizes the LED portion. The pixels are substantially transparent, due to the LEDs being microscopic and the pixel areas being much larger, to allow light from the underlying layers to pass through. The three layers of pixels are aligned so that a combination of a single top red pixel, a single underlying green pixel, and a single underlying blue pixel form a single multi-color pixel. The different layers have transparent column and row lines.

15 Claims, 4 Drawing Sheets

Related U.S. Application Data continuation of application No. 16/546,047, filed on Aug. 20, 2019, now Pat. No. 10,636,772.

(60) Provisional application No. 62/875,331, filed on Jul. 17, 2019.

(56) References Cited

U.S. PATENT DOCUMENTS

| | | |
|---|---|---|
| 11,164,851 B2 * | 11/2021 | Ray ..................... H01L 25/0753 |
| 2013/0221368 A1 | 8/2013 | Oraw |
| 2014/0209936 A1 | 7/2014 | Oraw |
| 2015/0357315 A1 | 12/2015 | Oraw |
| 2016/0240118 A1 * | 8/2016 | Ray ........................ G09G 3/003 |
| 2017/0294488 A1 | 10/2017 | Lin et al. |
| 2019/0229234 A1 | 7/2019 | Zou et al. |
| 2021/0050334 A1 | 2/2021 | Ray et al. |

* cited by examiner

THREE-LAYER COLOR DISPLAY USING STACKED LED LAYERS

CROSS-REFERENCE TO RELATED APPLICATIONS

This application is a continuation of U.S. application Ser. No. 16/843,590, filed Apr. 8, 2020, which is a continuation of U.S. application Ser. No. 16/546,047, filed Aug. 20, 2019, now U.S. Pat. No. 10,636,772, issued on Apr. 28, 2020, which claims the benefit of U.S. provisional application Ser. No. 62/875,331, filed Jul. 17, 2019.

FIELD OF THE INVENTION

This invention relates to addressable displays using printed microscopic light emitting diodes (LEDs) in each pixel location.

BACKGROUND

The present assignee has developed a printable LED light sheet where microscopic inorganic LED dies, having a top electrode and a bottom electrode, are printed as an ink on a conductive layer on a thin substrate. Such LEDs are called vertical LEDs. The ink comprises the pre-formed LED dies uniformly infused in a solvent. After the ink is cured, the bottom electrodes of the LEDs make electrical contact to the conductive layer. A dielectric layer is then deposited between the LEDs, and another conductive layer is printed to make electrical contact to the top electrodes of the LEDs to connect the LEDs in parallel. A suitable voltage is applied to the two conductive layers to illuminate the LEDs. To allow light to escape, one or both of the conductive layers is transparent. Indium tin oxide (ITO) or sintered silver nanowires may be used for the transparent conductive layer. Other conductive oxides may also be used. Such a technique is described in the assignee's U.S. Pat. No. 9,343,593, entitled, Printable Composition of a Liquid or Gel Suspension of Diodes, and related patents, incorporated herein by reference.

A simplified example of a single printable LED is shown in FIG. 1. The LED 10 has a bottom electrode 12, which is typically a reflective metal, and a top electrode 14. The semiconductor portion 16 may comprise a conventional GaN n-type layer and p-type layer sandwiching a GaN active layer. In one embodiment, the GaN-based LED emits blue light. The color emission is based on the material composition. In other embodiments, green and red LEDs may be printed. Light 18 is emitted from the top if the bottom electrode 12 is opaque.

The LED 10 is formed to have a relatively thin and tall top electrode 14 so that the LEDs orient themselves correctly on a substrate when printed as a liquid ink.

The assignee has also previously invented an "active LED", as shown in FIG. 2, where a vertical LED 20 and a vertical transistor 22 are bonded together or formed on the same substrate. The active LED 24 has a top electrode 26, a bottom electrode 28, and a transistor control electrode 30. The transistor 22 may be a FET or a bipolar transistor. Such an active LED is described in the assignee's U.S. Pat. Nos. 9,661,716; 9,572,222; and 10,201,051, all of which are incorporated by reference.

FIG. 3 is a schematic diagram of the active LED 24 of FIG. 2. The transistor 22 is labeled a pMOS transistor, but it may also be an nMOS transistor.

The assignee also has various patents describing forming a full color display using the LED 10 or the active LED 24 in pixel locations in a single layer. In one embodiment, the LEDs all emit blue light, and red and green phosphors are used to create the red, green, and blue pixels for a full color display. In other embodiments, different semiconductor material compositions of the LEDs are used to create red, green, and blue emitting LEDs, and various techniques are used to energize the RGB LEDs to display images.

Since the RGB LEDs are all in the same plane on a substrate, it is difficult to form and separately energize the various RGB pixels. Forming the RGB pixels in the same plane requires the red pixels to be relatively spread out to make room for the green and blue pixels. The green and blue pixels must also be similarly spread out. Further, the column and row lines must have a high density for selectively energizing the RGB pixels. Further, if different materials are used to form the RGB LEDs, they will need different driving currents due to their different efficiencies, which complicates the drivers. If phosphors are used, the phosphors are relatively expensive, may have significant persistence times, and are difficult to precisely align with the pixels.

One example of a single-plane, addressable RGB display is described in the assignee's U.S. Pat. No. 9,368,549, incorporated by reference, and shown in FIG. 4. On a substrate 34 are formed conductive column lines 36. A reflective (e.g., white) hydrophobic mesh 38 is printed that creates a 2-dimensional grid of pixel locations. An LED ink is then printed and cured to print the LEDs 10 in each pixel location, where the bottom electrodes of the LEDs 10 electrically contact the associated column lines 36. There may be a random number of LEDs 10 in each pixel location due to the non-determinative printing process. A dielectric layer 40 is deposited between the LEDs 10. Transparent row lines 42 are then deposited to contact the top electrodes 14. It is assumed that all the LEDs 10 emit blue light. To form the red and green pixels, red and green phosphors 44 and 46 are printed over the red and green pixels. A controller 48 controls an addressable column driver 50 and an addressable row driver 52 to select individual RGB pixels to display a color image. The LEDs 10 may be simultaneously or sequentially illuminated. The brightness may be controlled by pulse width modulation or current magnitude.

Drawbacks of the single-plane display of FIG. 4 have been mentioned above.

What is needed is a technique for forming a full-color, addressable display using printed LEDs which does not have the drawbacks of the single-plane displays described above.

SUMMARY

A stacked RGB display is described herein. One of the layers only includes printed red LED pixels. The LEDs are pre-formed, inorganic LEDs that are printed as an ink and cured. The red pixels are a 2-dimensional array of areas that are defined using screen printing, flexography, gravure, a hydrophobic mesh, inkjet, or other printing technique. Each pixel location includes one or more of the red LEDs, where the number of LEDs per pixel is random due to the non-determinative printing process. Since each LED is microscopic, such as having a width of 50 microns or less, and each pixel area may be on the order of 0.5-1 mm in diameter, the vast majority of the pixel area is transparent. Larger pixels areas may be formed for larger displays, such as for billboards. The individual LEDs are assumed to be opaque due to a reflective bottom electrode (e.g., formed of silver).

Row and column lines are transparent and are used to selectively address any of the red pixels. All the LEDs in a single pixel are connected in parallel by a column or row line.

Two additional LED layers are formed for the green and blue pixels, using printed green and blue LEDs in the respective pixel areas. Since different materials may be used to form the red, green, and blue LEDs, no phosphor is needed. Forming red, green, and blue LEDs is well within the ability of those skilled in the art.

The three layers of the RGB pixels may then be aligned and laminated together, or the layers may be printed over each other. The red, green, and blue pixels are vertically aligned with each other to form an array of tri-color pixels. Assuming the top layer is red, the middle layer is green, and the bottom layer is blue, the blue light passes upward through the transparent areas of the overlying green and red pixels, and the green light passes upward through the transparent areas of the overlying red pixels. The order of the layers may depend on the absorbency of the overlying layers to particular wavelengths emitted by the underlying layers.

The bottom substrate, such as for the blue pixels, may be opaque if the display is to emit light in a single direction. The bottom substrate may be a reflective white or an absorbing black. If all the substrates are transparent, the display may emit light bidirectionally.

The row and column lines for each RGB layer may be selectively controlled by addressable column line drivers and row line drivers. The RGB pixels may be illuminated sequentially or simultaneously.

Other embodiments are described.

BRIEF DESCRIPTION OF THE DRAWINGS

Elements that are similar or identical in the various figures are labeled with the same numeral.

DETAILED DESCRIPTION

Figure 1:
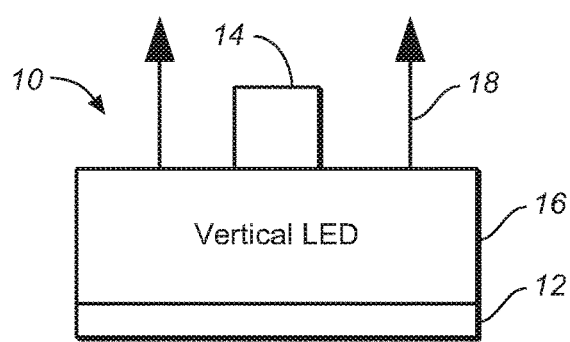
FIG. 1 is a cross-sectional view of a prior art printable LED die.
Figure 5:
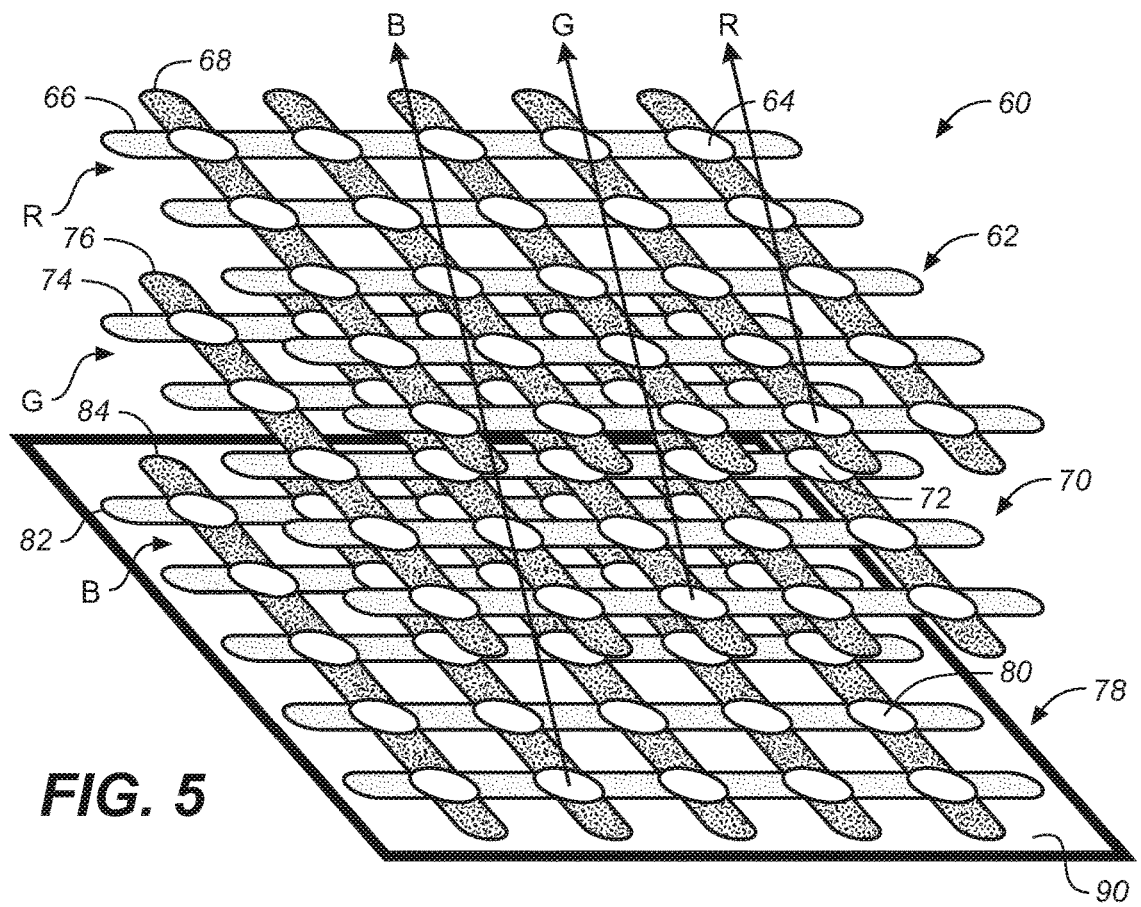
FIG. 5 is an exploded view of one embodiment of the invention where a red pixel layer, a green pixel layer, and a blue pixel layer are vertically stacked, to create a 3-dimensional full color display, where the light from underlying pixels passes through the transparent portions of overlying pixels.

FIG. 5 is an exploded view of one embodiment of the invention, which is a color display 60 formed by printing pre-formed LED dies or pre-formed active LED dies (having an integrated transistor and LED). The printed LEDs may be the LED 10 of FIG. 1 or the active LED 24 of FIG. 2. The printed active LED may also be an LED and transistor formed on the same substrate. The assignee's various patents on printing such LEDs, mentioned above, provide details of the printing process. In the below disclosure, the term LED is used to mean either LED dies or the active LED dies.

In one embodiment of the assignee's printing method, LEDs are completely formed on a wafer, including the anode and cathode metallizations, by using one or more carrier wafers during the processing and removing the growth substrate to gain access to both LED surfaces for metallization. The LED wafer is bonded to the carrier wafer using a dissolvable bonding adhesive. After the LEDs are formed on the wafer, trenches are photolithographically defined and etched in the front surface of the wafer around each LED, to a depth equal to the bottom electrode, so that each LED has a diameter of less than 50 microns and a thickness of about 4-20 microns, making them essentially invisible to the naked eye. A preferred shape of each LED is hexagonal. The trench etch exposes the underlying wafer bonding adhesive. The bonding adhesive is then dissolved in a solution to release the LEDs from the carrier wafer. Singulation may instead be performed by thinning the back surface of the wafer until the LEDs are separated. The microscopic LEDs are then uniformly infused in a solvent, including a viscosity-modifying polymer resin, to form an LED ink for printing.

The orientation of the printed LEDs can be controlled by providing a relatively tall top electrode (e.g., the anode electrode), so that the top electrode orients upward by taking the fluid path of least resistance through the solvent after printing. By providing a heavier bottom electrode, the LEDs also self-orient. The anode and cathode surfaces may be opposite to those shown. The precise locations of the LEDs are random, but the approximate number of LEDs printed per unit area can be controlled by the density of LEDs in the ink. A monolayer of LEDs is achieved by the printing process.

In the example of FIG. 5, a top layer 62 (third layer) of the display 60 contains red emitting LEDs printed in a 2-dimensional array (third 2-dimensional array) of red pixels 64 (third pixels). The locations of the pixels 64 may be determined by screen printing or any other form of printing, including flexography, gravure, inkjet, etc. In another embodiment, the LEDs are blanket printed with a substantially uniform distribution of LEDs over the display surface, where the pixels are defined by the locations of vertically intersecting row and column lines.

Transparent column lines 66 (third column lines) for the red pixels are printed on a transparent dielectric layer (not shown in FIG. 5 for simplicity), using any suitable printing technique. Transparent conductors may be cured ITO or sintered nano-wires. The LEDs are printed over the column lines 66 in the pixels 64, such as by using screen printing, where there is a random number of LEDs in each pixel 64 as a natural result of printing the LEDs in an ink. For example, each pixel 64 may have about 2-5 LEDs. If the pixels 64 were larger, such as for a billboard, there may be more LEDs in each pixel 64. The LEDs in each pixel 64 are generally spaced relatively far apart since the LEDs are only on the order of 50 microns wide, and the pixel width may be on the order of 1.0-0.5 mm. There may be any number of pixels 64, depending on the desired resolution. In one embodiment, there are as many pixels 64 as a conventional high-definition television screen. The printed LED ink is then cured, such as by heat lamps, to evaporate the ink solvent and cause the bottom electrodes of the LEDs to electrically contact the associated column lines 66.

After the red LEDs are printed, a transparent dielectric layer is deposited that insulates the column lines 66 and surrounds the red LEDs but exposes the top electrode.

Then, transparent row lines 68 (third row lines) are printed that are aligned with the top electrodes of the LEDs. The row lines 68, after curing, make electrical contact to the top electrodes of the associated LEDs. All LEDs within the same pixel 64 are connected in parallel by the column lines 66 and row lines 68. Any red pixel 64 may be illuminated (addressed) by providing power to a particular column line and row line, where the vertical LEDs in the pixel 64 at the intersection of the energized column line and row line are illuminated.

The middle layer 70 (second layer) of the display 60 contains an array of green pixels 72 (second pixels) in a second 2-dimensional array formed by printing green emitting LEDs, transparent column lines 74 (second column lines), and transparent row lines 76 (second row lines) on a transparent dielectric layer (not shown) in the same way used to form the top layer 62. No phosphor needs to be used for the different color pixels.

The bottom layer 78 (first layer) of the display 60 contains an array of blue pixels 80 (first pixels) in a first 2-dimensional array formed by printing blue emitting LEDs, transparent column lines 82 (first column lines), and transparent row lines 84 (first row lines) on a transparent substrate 90 in the same way used to form the top layer 62.

To reduce conductor resistance, narrow, opaque metal buses may be formed between the pixels that electrically connect to the higher resistance transparent column and row lines.

The red pixels 64, green pixels 72, and blue pixels 80 are vertically aligned so that the relative simultaneous brightnesses of the LEDs within vertically aligned red, green, and blue pixels appear to the human eye as a single a tri-color pixel that may have a wide gamut of colors similar to a conventional color display. Time division multiplexing may also be used for the red, green, and blue pixels to combine the colors.

The three layers of red, green, and blue pixels may be aligned and laminated together, or the layers may be printed/deposited over one another. If all layers are to be printed over each other, after an underlying pixel layer is formed, a liquid dielectric layer may be deposited and cured to form a substantially planarized dielectric surface for an upper pixel layer.

Figure 6:
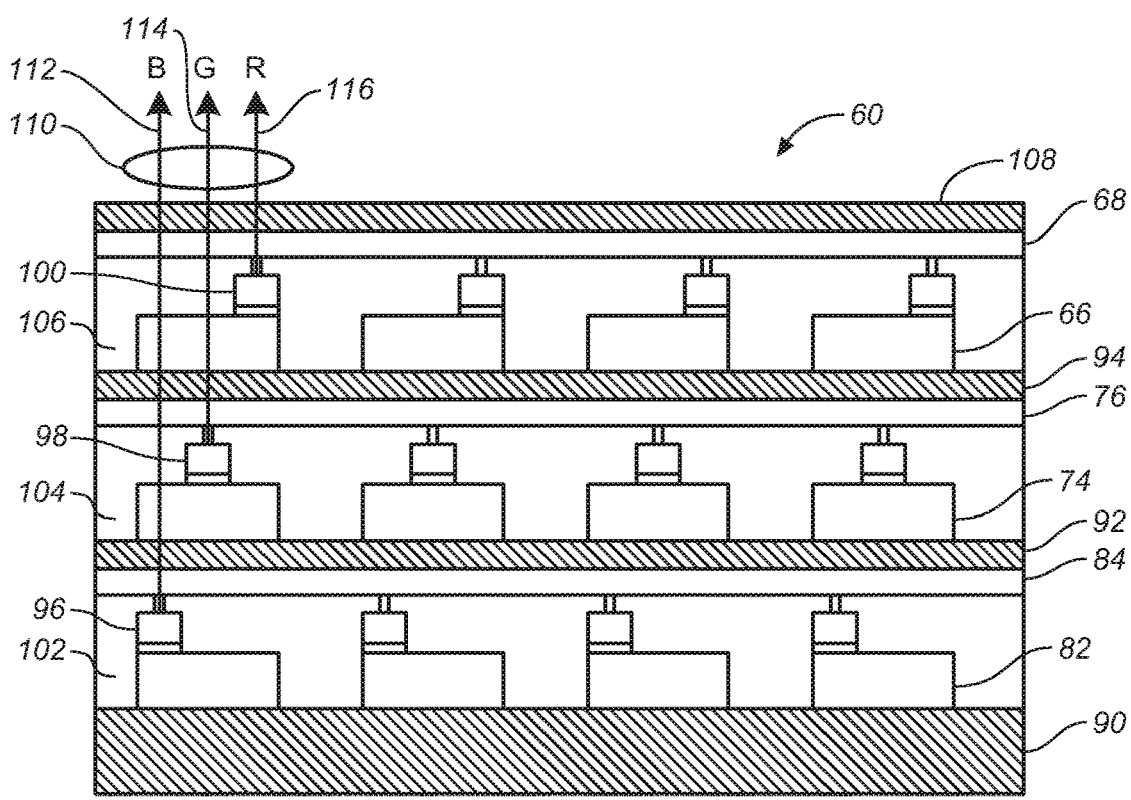
FIG. 6 is a cross-sectional view of the display of FIG. 5, showing the various layers with a single bisected LED per pixel area for simplicity.

FIG. 6 is an unexploded cross-sectional view of the structure of FIG. 5. FIG. 6 further shows the dielectric starting surface for each layer. The thicknesses of the various components are not to scale.

The LEDs may be printed using a masked screen printing process where the LEDs are only printed over the column lines within each pixel location. Any other suitable printing process may also be used, such as inkjet printing.

In another embodiment, the LEDs are blanket printed to form a generally uniform monolayer of LEDs over the column lines. In such an embodiment, LEDs that are located between the column lines do not light up. If the column lines have gaps less than about 50 microns (the widths of the LEDs), some LEDs may span two column lines and light up when either column line is energized. If LEDs are blanket printed, the pixel locations are desirably close together so LEDs are not wasted.

In the simplified view of FIG. 6, only one LED per column line is bisected by the cross-section.

The starting substrate 90 may be polycarbonate, PET (polyester), PMMA, Mylar, other type of polymer sheet, or other material. In one embodiment, the substrate 90 is about 12-250 microns thick. The size is approximately the desired size of the display. The substrate 90 may be transparent, reflective (e.g., white), or black. The various transparent column lines 82, 74, and 66 are printed over the respective substrate 90 and dielectric layers 92 and 94. The dielectric layers 92 and 94 may be a dielectric layer deposited over an underlying layer or may be laminated. Printing the overlapping layers is preferred since it is easier to align the pixels during a printing process rather than align the sheets using a lamination process.

The blue LEDs 96, green LEDs 98, and red LEDs 100 are printed over their respective column lines 82, 74, and 66. Dielectric layers 102, 104, and 106 are deposited between the LEDs in each layer.

Transparent row lines 84, 76, and 68 are printed over the LEDs and dielectric layers 102, 104, and 106.

A top dielectric layer 108 protects the display.

A single tri-color pixel 110 is shown that is a composition of blue light 112, green, light 114, and red light 116 from three vertically aligned pixels. As seen, the light emitted by underlying LEDs passes through overlying pixels due to a vast majority of each pixel area being transparent.

The row lines and column lines may be reversed, where the LEDs are printed over the row lines.

Figure 7:
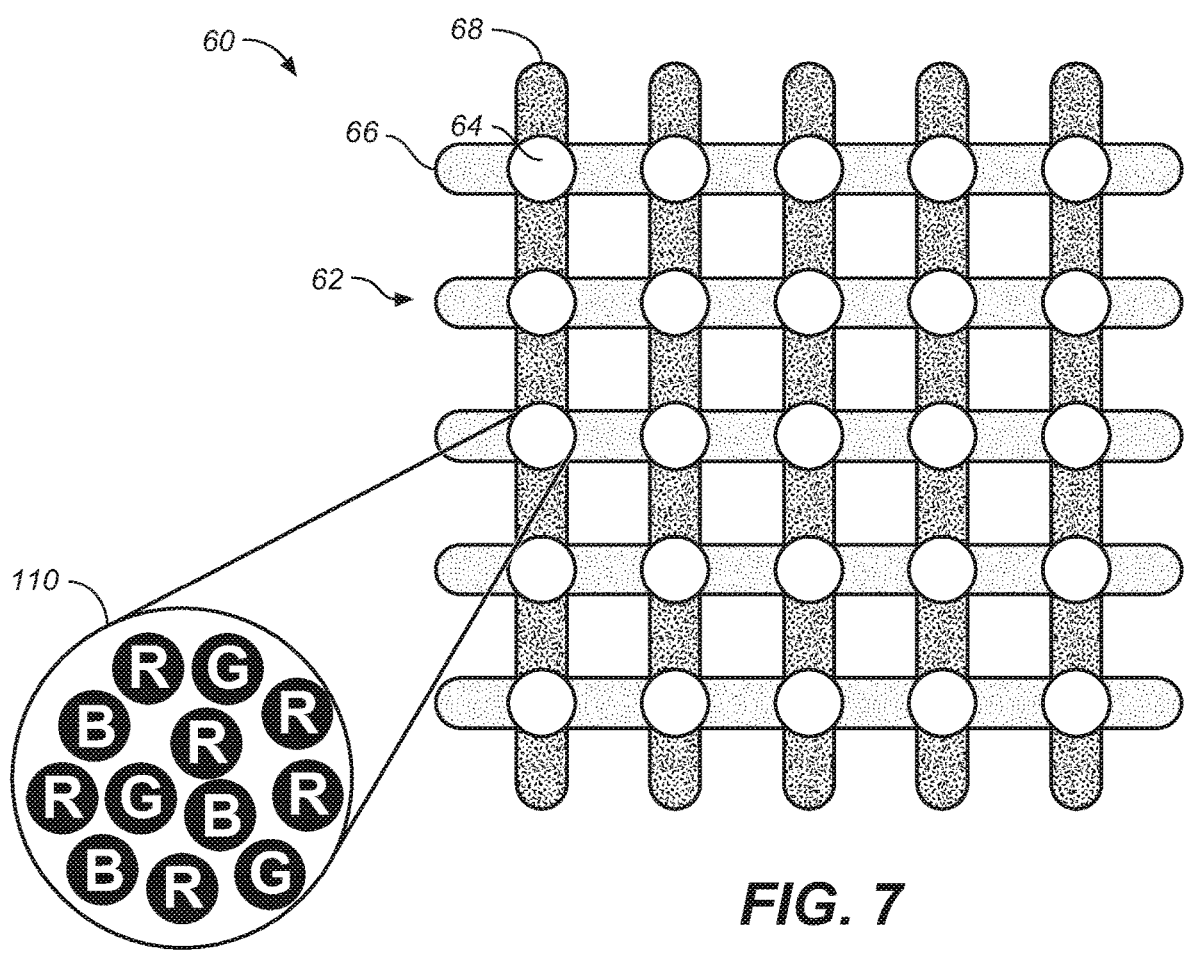
FIG. 7 is a top down view of the completed display screen, showing the overlapping pixel areas, where a single pixel area (mostly transparent) is magnified to show how red, green, and blue LEDs are laterally spaced apart by the non-determinative printing process so that, for example, the blue light from the bottom layer can pass through the transparent areas of the overlying green and red pixels.

FIG. 7 is a top down view of the display 60 of FIGS. 5 and 6 showing the top layer 62. The pixel areas are mostly transparent except for the LEDs. One tri-color pixel 110 is magnified to show examples of the positions of the red, green, and blue LEDs in the three vertically aligned pixels. The number of each type of LED per tri-color pixel is random. However, applying the same current to pixels containing different numbers of the same type of LED produces substantially the same brightness per pixel, since the current is shared by all LEDs in a single pixel. In the example, there are six red LEDs, three blue LEDs, and three green LEDs in the tri-color pixel 110.

Figure 8:
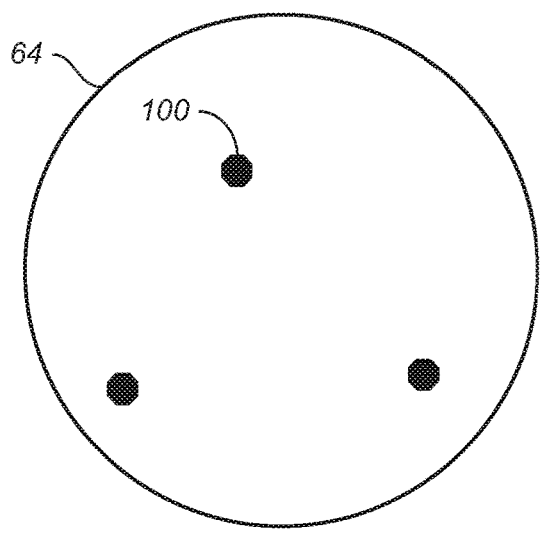
FIG. 8 illustrates a typical one of the pixels, containing three printed LEDs, to show the relative amount of transparent area vs. area obscured by the LEDs.

FIG. 8 shows a single red pixel 64 containing three printed red LEDs 100. The LEDs 100 are opaque, but a majority of the pixel 64 is transparent. Further, since the bottom electrode of the LEDs 100 may be a reflective silver, any light from an underlying green or blue LED may be reflected back and ultimately reflected upward off the bottom substrate if the bottom substrate is reflective.

Figure 9:
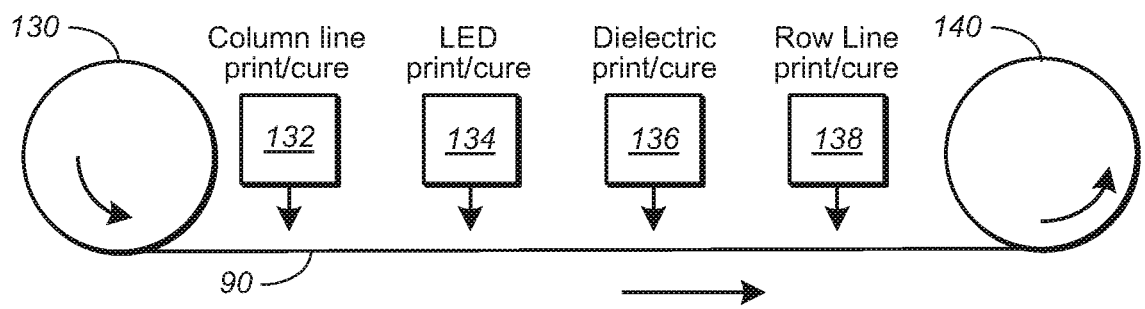
FIG. 9 illustrates a roll-to-roll printing process where the entire color display may be printed under atmospheric conditions.

FIG. 9 schematically illustrates how the entire display 60 can be formed under atmospheric conditions in a roll to roll printing process, enabling the formation of very large displays. Segments of the display may also be formed and then tiled together upon installation. Although the various stations are shown sequentially, the substrate 90 may be stationary, and the various layers may be printed over the stationary substrate 90 using different printing tools and materials.

The substrate 90 is initially supplied on a roll 130. The column lines are printed at station 132 and cured. The LED ink is printed at station 134 and cured. The dielectric layers are printed at station 136 and cured. The transparent row lines are printed at station 138 and cured. The resulting flexible display 60 may then be taken up by a take-up roller 140 or cut into flat sheets.

Figure 10:
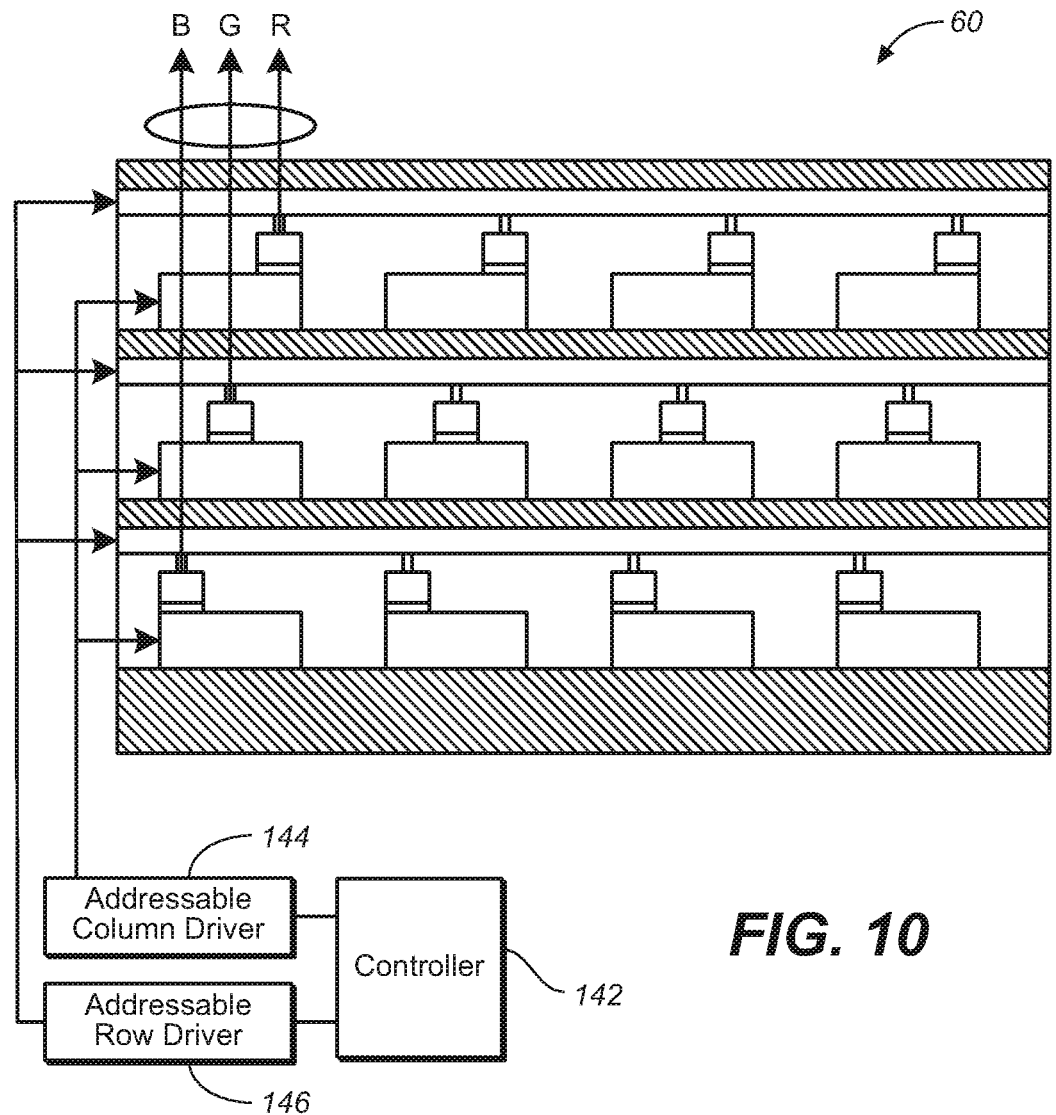
FIG. 10 illustrates the display of FIG. 6 connected to control circuitry for the selective control of the overlapping red, green, and blue pixels.

FIG. 10 illustrates the completed display 60 of FIG. 6 with a controller 142 controlling an addressable column driver 144 for selectively energizing any column line either sequentially or simultaneously, and controlling an addressable row driver 146 in coordination with controlling the addressable column driver 144, for selectively energizing any red, green, or blue LED in the display 60 to create a perceived color for all the tri-color pixels.

Any size, highly flexible display can be formed using the above-described technique. The order of the RGB layers may be changed to be the most efficient. Using micro-LEDs instead of large conventional LEDs may be more efficient due to smaller LEDs having less internal light absorption and lower heat generation. Since the micro-LEDs are widely dispersed, the heat is well dispersed within the display.

Figure 2:
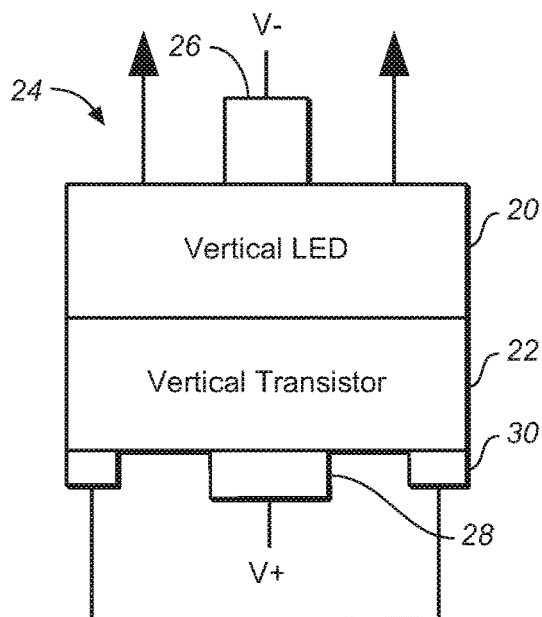
FIG. 2 is a cross-sectional view of a prior art printable active LED, with an integrated vertical transistor and vertical LED.
Figure 3:
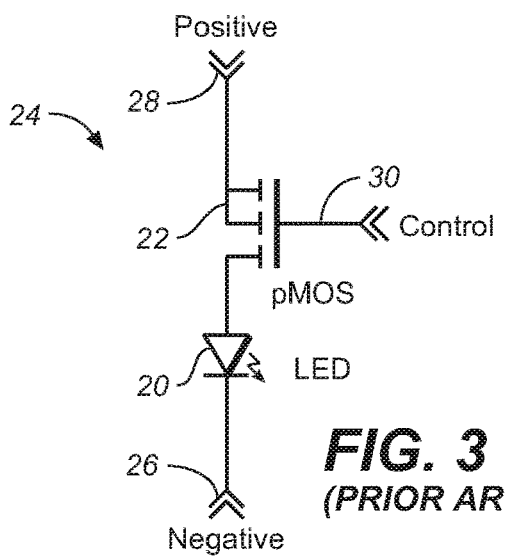
FIG. 3 is a schematic diagram of a pMOS version of the active LED of FIG. 2.
Figure 4:
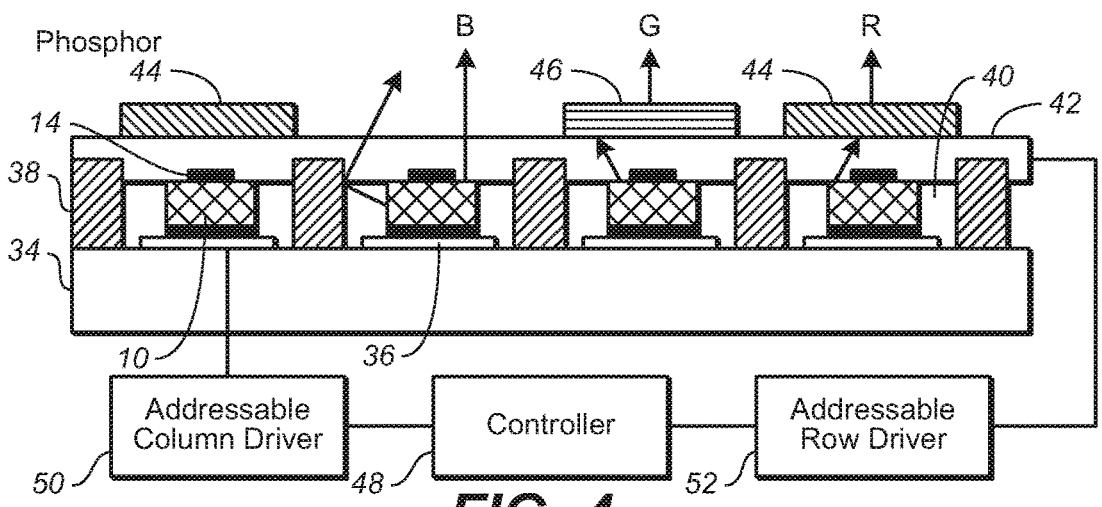
FIG. 4 is a cross-sectional view of a prior art single-layer RGB display using printed blue LEDs and red and green phosphors.

The LEDs shown may also be the active LEDs of FIG. 2. In such a case, only a low power control voltage needs to be applied to the active LED control terminal to energize a pixel, while the anode and cathode voltages remain static. This technique may simplify the addressing and enable faster control of the active LEDs. For the active LEDs, a third conductor line needs to be added to the display layers for the control lines.

Additional layers may be used if additional "primary" colors are desired for each multi-color pixel. For example, adding a yellow emitting layer may enhance vibrancy of a multi-color pixel output. However, three primary colors are deemed sufficient to produce a suitable gamut of colors for each multi-color pixel.

Since the RGB pixels are in different planes, there are parallax issues if the display is viewed at a wide angle. Therefore, the layers should be made as thin as possible, such as about 100-50 microns thick. Pixel lenses may be formed over the top layer, or a laminated lens sheet may be used, to reduce the parallax effect. Also, the size of the pixels underlying the top layer may be enlarged to further reduce the parallax effect. The display may also be curved to reduce the parallax effect.

If a self-contained display is desired, the bottom substrate may be formed of a flat battery, such as a printed battery. Inductive power may also be used to power the display, such as by incorporating an inductive coil below the bottom substrate.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A display comprising:
   stacked layers having a major top surface for emitting light comprising:
   a first layer forming an array of first pixels that emit light of a first color, the first pixels containing first light emitting diodes (LEDs) that emit light of the first color;
   a second layer, overlying the first layer, forming an array of second pixels that emit light of a second color, the second pixels containing second LEDs that emit light of the second color, the second layer having first substantially transparent portions to pass the light of the first color; and
   a third layer, overlying the second layer, forming an array of third pixels that emit light of a third color, the third pixels containing third LEDs that emit light of the third color, the third layer having second substantially transparent portions to pass the light of the first color and the second color,
   wherein the first LEDs, the second LEDs, and the third LEDs are not directly overlapping normal to the major top surface,
   wherein the first substantially transparent portions directly overlap the first LEDs normal to the major top surface, and the second substantially transparent portions directly overlap the first LEDs and the second LEDs normal to the major top surface, such that a combination of the first color, the second color, and the third color are emitted from the major top surface; and
   wherein pixel sizes of the first pixels and the second pixels are larger than pixel sizes of the third pixels, such that aligned pixels in the first pixels, the second pixels, and the third pixels visually overlap to a viewer within a range of angles to reduce parallax effects.

2. The display of claim 1 wherein there are a plurality of the first LEDs in each of the first pixels, a plurality of the second LEDs in each of the second pixels, and a plurality of the third LEDs in each of the third pixels,
   wherein spaces between the second LEDs in each of the second pixels form the first substantially transparent portions, and spaces between the third LEDs in each of the third pixels form the second substantially transparent portions.

3. The display of claim 1 wherein the first pixels, the second pixels and the third pixels are aligned so that a combination of a single first pixel, a single second pixel, and a single third pixel form a single multi-color pixel, such that the display is formed of an array of multi-color pixels.

4. The display of claim 3 wherein, at least for some of the multi-color pixels, there are different numbers of the first LEDs, the second LEDs, and the third LEDs.

5. The display of claim 1 wherein the first LEDs, the second LEDs, and the third LEDs are pre-formed inorganic LEDs that have been printed in the first pixels, the second pixels, and the third pixels.

6. The display of claim 1 wherein each of the first LEDs, the second LEDs, and the third LEDs comprises an LED portion and an integrated transistor portion.

7. The display of claim 1 wherein a combination of the first color, the second color, and the third color produce a combination of red, green, and blue light.

8. The display of claim 1 wherein no wavelength conversion material is used in the display for producing the first color, the second color, and the third color.

9. The display of claim 1 further comprising:
   the first pixels being formed in a first 2-dimensional array having first column lines and first row lines connected to the first LEDs;
   the second pixels being formed in a second 2-dimensional array having transparent second column lines and transparent second row lines connected to the second LEDs; and the third pixels being formed in a third 2-dimensional array having transparent third column lines and transparent third row lines connected to the third LEDs.

10. The display of claim 1 wherein there is a random number of the first LEDs in the first pixels, there is a random number of the second LEDs in the second pixels, and there is a random number of the third LEDs in the third pixels.

11. The display of claim 1 wherein the first layer is formed on a substrate, the second layer is formed on a first dielectric layer, and the third layer is formed on a second dielectric layer.

12. The display of claim 1 wherein the second layer and the third layer are deposited over the first layer.

13. The display of claim 1 wherein the first LEDs, the second LEDs, and the third LEDs are less than about 50 microns in width.

14. The display of claim 1 wherein the first LEDs, the second LEDs, and the third LEDs are printed pre-formed inorganic LEDs.

15. The display of claim 1 wherein the first LEDs, the second LEDs, and the third LEDs are inorganic LEDs having top electrodes and bottom electrodes.

* * * * *